(12) United States Patent
Jeong et al.

(10) Patent No.: US 11,005,029 B2
(45) Date of Patent: May 11, 2021

(54) SPIN TRANSFER TORQUE SWITCHING OF A MAGNETIC LAYER WITH VOLUME UNIAXIAL MAGNETIC CRYSTALLINE ANISTOTROPY

(71) Applicants: Samsung Electronics Co., LTD., Gyeonggi-do (KR); INTERNATIONAL BUSINESS MACHINES CORPORATION, Armonk, NY (US)

(72) Inventors: Jaewoo Jeong, Los Altos, CA (US); Mahesh G. Samant, San Jose, CA (US); Stuart S. P. Parkin, San Jose, CA (US); Yari Ferrante, San Jose, CA (US)

(73) Assignees: Samsung Electronics Co., Ltd., Gyeonggi-do (KR); INTERNATIONAL BUSINESS MACHINES CORPORATION

( * ) Notice: Subject to any disclaimer, the term of this patent is extended or adjusted under 35 U.S.C. 154(b) by 4 days.

(21) Appl. No.: 16/146,728

(22) Filed: Sep. 28, 2018

(65) Prior Publication Data

US 2020/0105999 A1    Apr. 2, 2020

(51) Int. Cl.
| | | |
|---|---|---|
| *H01L 43/02* | (2006.01) | |
| *G11C 19/08* | (2006.01) | |
| *G11C 11/16* | (2006.01) | |
| *H01L 43/10* | (2006.01) | |

(52) U.S. Cl.
CPC .............. *H01L 43/02* (2013.01); *G11C 11/16* (2013.01); *G11C 19/0841* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 6,834,005 | B1 | 12/2004 | Parkin |
| 8,008,097 | B2 | 8/2011 | Parkin |
| 9,425,387 | B1 | 8/2016 | Liu |
| 10,177,305 | B2 | 1/2019 | Jeong |
| 10,396,123 | B2 | 8/2019 | Jeong |
| 2006/0183002 | A1* | 8/2006 | Yang ................... G11B 5/3903 428/811 |
| 2013/0292806 | A1 | 11/2013 | Ma |

(Continued)

OTHER PUBLICATIONS

Bedau et al., Spin-Transfer Pulse Switching: From the Dynamic to the Thermally Activated Regime, Applied Physics Letters, 97, 262502, 2010.

(Continued)

*Primary Examiner* — Raj R Gupta
(74) *Attorney, Agent, or Firm* — Van Pelt, Yi & James LLP

(57) ABSTRACT

A device is disclosed. The device includes a first magnetic layer and a tunnel barrier. The first magnetic layer has a volume uniaxial magnetic crystalline anisotropy. The magnetic moment of the first layer is substantially perpendicular to the first layer. The tunnel barrier is in proximity to the first magnetic layer. The orientation of the magnetic moment of the first magnetic layer is reversed by spin transfer torque induced by current passing between and through the first magnetic layer and the tunnel barrier.

20 Claims, 16 Drawing Sheets

(56) References Cited

U.S. PATENT DOCUMENTS

| | | | |
|---|---|---|---|
| 2014/0077319 A1 | 3/2014 | Noma | |
| 2015/0348837 A1* | 12/2015 | Shaviv | H01L 21/76877 |
| | | | 438/653 |
| 2016/0125924 A1 | 5/2016 | Kita | |
| 2016/0333200 A1 | 11/2016 | Agrawal | |
| 2018/0006213 A1* | 1/2018 | Park | G11C 11/15 |
| 2018/0068681 A1 | 3/2018 | Sasaki | |
| 2018/0205008 A1* | 7/2018 | Jeong | G11C 11/161 |
| 2018/0366642 A1 | 12/2018 | Yang | |
| 2019/0035849 A1* | 1/2019 | Jeong | G11C 11/161 |
| 2019/0074041 A1* | 3/2019 | Jung | H01L 27/222 |
| 2019/0109277 A1* | 4/2019 | Jan | H01L 43/08 |
| 2019/0237661 A1* | 8/2019 | Iwata | H01F 10/3286 |
| 2019/0305040 A1* | 10/2019 | Jeong | H01L 27/222 |

OTHER PUBLICATIONS

Graf et al., Simple Rules for the Understanding of Heusler Compounds, Progress in Solid State Chemistry, 39, 2011.

Niesenet al., "Titanium nitrite as a seed layer for Heusler compounds", 2015, J. Appl. Phys., 118, 243904, pp. 1-7. (Year: 2015).

\* cited by examiner

SPIN TRANSFER TORQUE SWITCHING OF A MAGNETIC LAYER WITH VOLUME UNIAXIAL MAGNETIC CRYSTALLINE ANISTOTROPY

TECHNICAL FIELD

The invention is in the field of magnetic random access memory (MRAM), and more particularly, MRAM devices that rely on spin transfer torque.

BACKGROUND

A magnetic tunnel junction (MTJ) forms the basic memory element of a novel, non-volatile magnetic random access memory (MRAM) that promises high performance and endurance, and, moreover has the potential to be scaled to extremely small sizes. A magnetic tunnel junction (MTJ) is composed of a sandwich of two magnetic electrodes separated by an ultra-thin insulating layer. One of these layers forms the memory or storage layer and the other layer forms a reference layer whose magnetic structure is not changed during operation of the MRAM. Electrical current that tunnels between the reference and memory magnetic electrodes is spin-polarized: the magnitude of the spin-polarization is determined by a combination of the electronic properties of the magnetic electrodes and "spin-filtering" properties of the tunnel barrier.

In current-day MRAM the magnetic state of the MTJ, whether the magnetization of the electrode that forms the memory layer is oriented parallel or anti-parallel to that of the reference electrode, is changed by passing a current through the MTJ. The current, which is innately spin-polarized, delivers spin angular momentum, that once a threshold current is exceeded results in switching of the direction of the magnetic memory electrode moment. This transfer of spin angular momentum exerts a spin transfer torque (STT) and the magnetic memory electrode switched by this method is referred to as STT-MRAM. The magnitude of the switching current is reduced when the magnetization of the electrodes is oriented perpendicular to the layers. The magnitude of this current is limited by the size of the transistors used to provide the write current. This means that the thickness of the switchable magnetic electrode (memory electrode) must be sufficiently small that it can be switched by the available current. Thus for magnetization values of ~1000 emu/cm$^3$, the electrode must have a thickness that does not exceed approximately 1 nm.

The most promising materials that are being explored today for MTJs for dense MRAM comprise ferromagnetic electrodes formed from alloys of Co, Fe and B, and tunnel barriers formed from MgO (e.g., U.S. Pat. No. 8,008,097). The ferromagnetic electrodes are made sufficiently thin that the magnetizations of these electrodes are oriented perpendicular to these layers. The perpendicular magnetic anisotropy (PMA) of Co—Fe—B layers arises from the interfaces between these layers and the tunnel barrier and/or the underlayer on which the Co—Fe—B layer is deposited. Thus, these layers must be made sufficiently thin that the interface PMA overcomes the demagnetization energy that arises from the magnetic volume and increases in proportion with the magnetic volume of the Co—Fe—B layer. In practice, this means that the PMA is too weak to overcome thermal fluctuations when the device size is reduced to below ~20 nm in size, since the thickness of the magnetic layer has to be below that required to maintain its moment perpendicular and below that needed to switch the magnetic layer with reasonable current densities. So far magnetic materials whose magnetic moments could be switched by STT in MRAM devices had either interfacial, shape, or no anisotropy. Such materials do not allow scaling of MRAM devices to sizes below ~20 nm. What is needed are new materials for the ferromagnetic electrodes which display much larger PMA than that exhibited by Co—Fe—B and that preferably the PMA arises from the volume or bulk of the electrodes. A promising class of magnetic materials that has such a property are Heusler compounds. Heusler alloys[1] are compounds with the chemical formula $X_2YZ$ or $X'X''YZ$ wherein X and X' and X'' and Y are transition metals or lanthanides (rare-earth metals) and Z is from a main group metal. The Heusler compounds have a structure of the type $Cu_2MnAl$ (defined in the Pearson Table) in which the elements are disposed on 4 interpenetrating face-centered cubic (fcc) lattices. Many compounds (~800) are known in this family (T. Graf et. al., Progress in Sol. State Chem. 39, 1 (2011)). Some of these compounds are ferromagnetic or ferrimagnetic due to magnetic moments on the X and/or Y sites. Moreover, whilst the parent Heusler compounds are cubic and exhibit weak or no significant magnetic anisotropy, the structure of some of these compounds is found to be tetragonally distorted: due to this distortion the magnetization exhibited by these compounds may be preferably aligned along the tetragonal axis. Thus, thin films formed from such materials may exhibit PMA due to a magneto-crystalline anisotropy associated with their tetragonally distorted structure. Some known examples of such tetragonal Heusler compounds are $Mn_3Z$ where Z=Ga, Ge, Sn, and Sb or $Mn_2CoSn$. The thickness of magnetic electrodes formed from Heusler alloys on $Si/SiO_2$ substrates with use of conducting underlayers, to date, far exceeds the thickness of 1 nm. The thinnest layers to date are for the Heusler compound $Mn_3Ge$, for which layers as thin as 5 nm showed perpendicular magnetic anisotropy and creasonably square magnetic hysteresis loops. Ultra-thin films (~1 nm thick) of these materials that exhibit large PMA grown on chemical templating layer (CTL) required use of single crystalline substrates such as MgO(100) or use of MgO seed layers on $Si/SiO_2$ substrates. Such single crystalline substrates or use of MgO as part of the seed layer are not useful for STT-MRAM applications in which the MTJs must be deposited on wires that are formed in today's CMOS based technologies from polycrystalline copper that may be covered with other layers that are also polycrystalline or amorphous. In order to be able to use ultra-thin tetragonal Heusler compounds as magnetic electrodes switchable by STT for MRAM a method for forming these compounds on amorphous or polycrystalline substrates or layers is needed.

SUMMARY

A device is disclosed. The device includes a first magnetic layer and a tunnel barrier. The first magnetic layer has a volume uniaxial magnetic crystalline anisotropy. The magnetic moment of the first layer is substantially perpendicular to the first layer. The tunnel barrier is in proximity to the first magnetic layer. The orientation of the magnetic moment of the first magnetic layer is reversed by spin transfer torque induced by current passing between and through the first magnetic layer and the tunnel barrier.

DETAILED DESCRIPTION

Heusler compounds form a unique structure defined by the space group symmetry $L2_1$ (or $D0_{22}$ when they are tetragonally distorted). The properties of Heusler compounds are strongly dependent on the chemical ordering of the elements constituting the compounds. Thus, the fabrication of high quality Heusler films typically requires high temperature thermal processes: for example, deposition at temperatures significantly above room temperature and/or thermal annealing at high temperatures (400° C. or higher). Such high temperatures cause inter-diffusion between various layers within the MTJ stack leading to poor performance of the MTJ and thus have to be avoided. Recently we have disclosed that highly textured, very smooth, high quality ultrathin films of Heusler compounds, which can be deposited without a thermal annealing process, using a non-magnetic chemical templating layer. This chemical templating layer is preferably formed from a binary alloy of Co—Ga or Co—Ge or Co—Sn or Co—Al with the B1 structure, the cubic version of $L1_0$. The chemical templating layer can be deposited at room temperature and is chemically ordered (i.e., the formation of alternating atomic layers of Co and Ga or Ge or Sn or Al) even at room temperature in some cases (Co—Al) or at significant annealing temperatures (400° C. and above for Co—Ga and Co—Ge, 200-300° C. for Co—Sn). We find that ultrathin films of Heusler compounds deposited on these templating layers are highly epitaxial, chemically ordered, high quality films with excellent magnetic properties, including especially high values of perpendicular magnetic anisotropy and square magnetic hysteresis loops (with the remanent moment in zero magnetic field being close to the saturation moment). We attribute this to the similarity between the B1 symmetry of the templating layer and the $L2_1$ or $D0_{22}$ symmetry of the Heusler layer. The Heusler compound can be selected from the group consisting of $Mn_{3.1-x}Ge$, $Mn_{3.1-x}Sn$, and $Mn_{3.1-x}Sb$, with x being in the range from 0 to 1.1. Alternatively, the Heusler compound may be a ternary Heusler, such as $Mn_{3.1-x}Co_{1.1-y}Sn$, wherein x≤1.2 and y≤1.0. The chemical templating layer needed insulating MgO layer as a seed layer which limits its utility in STT-MRAM application as the switching current flows through the MTJ device. Here we show that use $Mn_xN$ (2.5≤x≤4) which is electrically conducting can be used as a seed layer for the chemical templating layer (CTL) allowing growth of ultra-thin Heusler films whose magnetic moment is switchable by STT.

Figure 1:
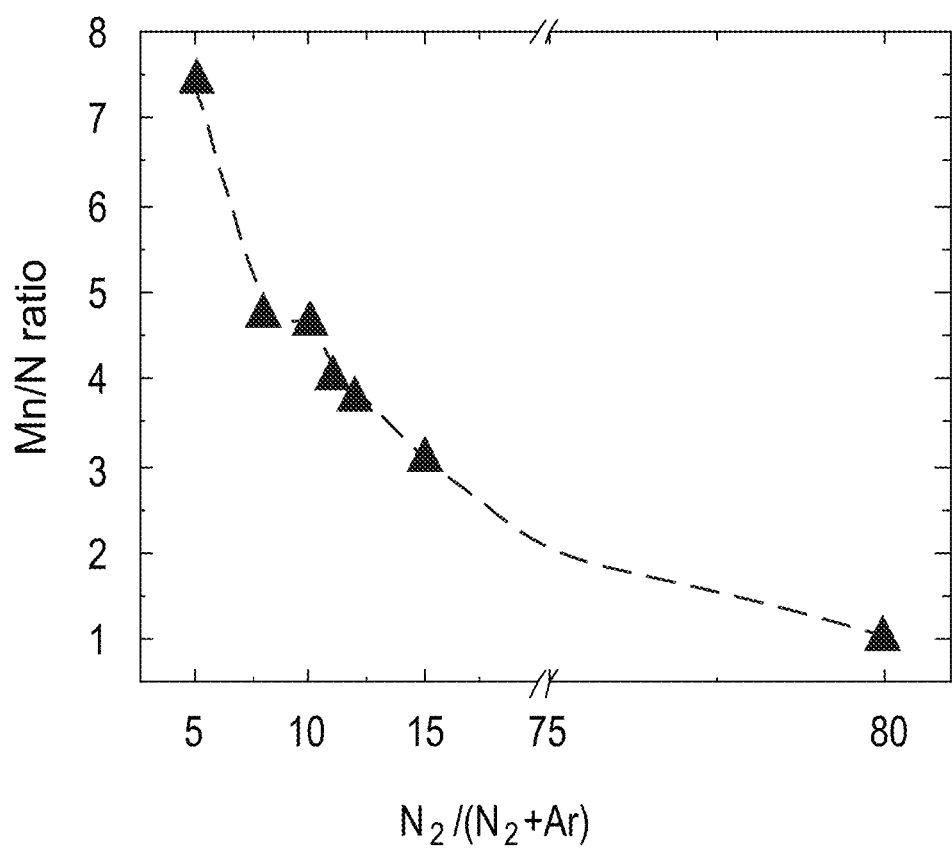
FIG. 1. Ratio of Mn:N as determined by RBS for Mn-Nitride films grown with different $N_2$ content in the sputter gas.

Mn-Nitride films were typically deposited on Si substrates with 25 nm thick thermally oxidized $SiO_2$ layer in an ultra-high vacuum chamber which had a base pressure of $\sim 1 \times 10^{-9}$ Torr. The Si substrates were sequentially cleaned in UV ozone chamber to remove any adsorbed organics, rinsed in a de-ionized water bath to remove water soluble contaminants and particulates, exposed to hot IPA vapors to remove water and finally dried in hot nitrogen furnace at ~60° C. The Mn-Nitride seed layer was deposited by reactive dc magnetron sputtering in a gas mixture of Ar and nitrogen from a Mn metal target at a gas pressure of $3 \times 10^{-3}$ Torr. The relative ratio of Mn:N within the Mn-Nitride layers can be controlled by tuning the $N_2$ content of the sputtering gas which was mixture of Ar and $N_2$ (see FIG. 1). The composition of the Mn-Nitride films was determined by Rutherford backscattering (RBS) from a series of 200 Å Mn-Nitride films deposited on graphite substrates and capped with 100 Å Pt to prevent their oxidation upon exposure to the ambient. The graphite substrates which contain predominantly carbon, an element with lower atomic number than Nitrogen, allow determination of Nitrogen content of the Mn-Nitride films to within +/−0.5%. The $Mn_xN$ films with composition of interest in this disclosure were obtained by varying $N_2$ content of the sputtering gas in the range of 10 to 20% with the preferred composition being $Mn_xN$ where 2.5≤x≤4. Alternately, it was possible to grow Mn-Nitride by sputtering from a $Mn_xN$ target.

Figure 2:
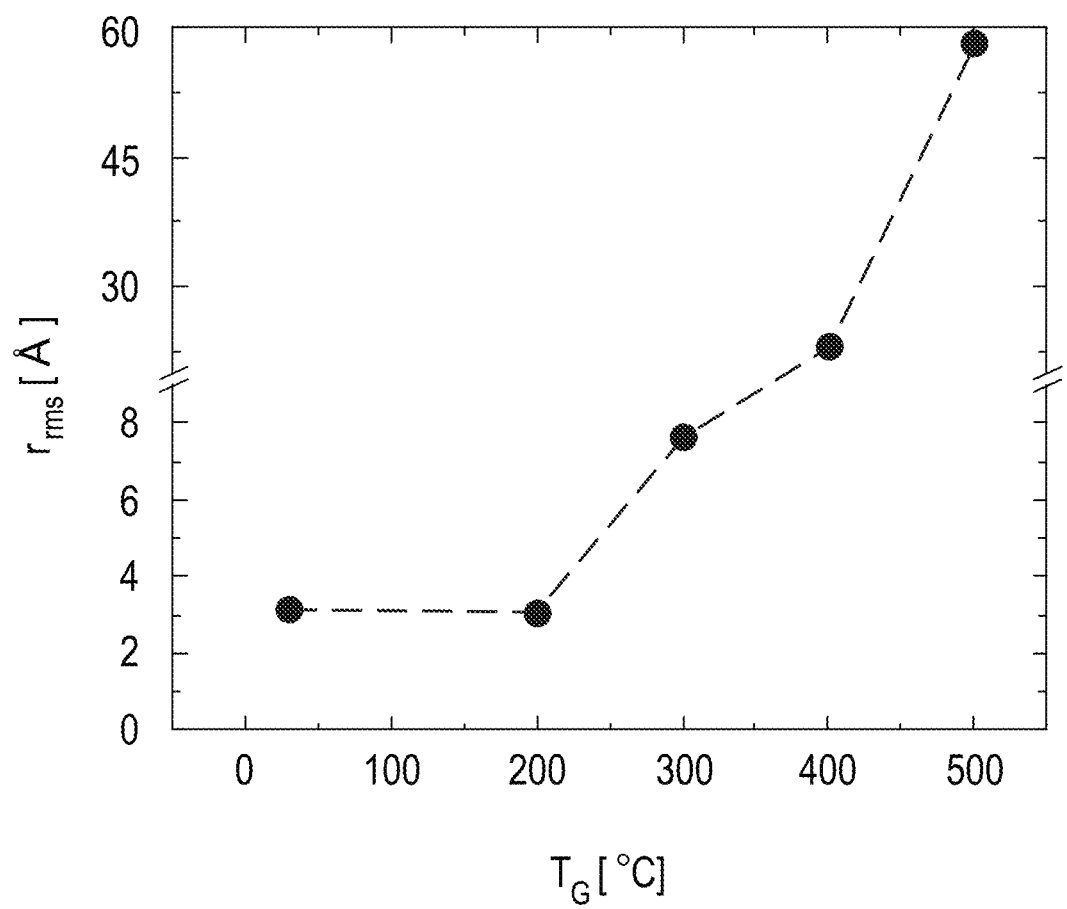
FIG. 2. The root mean square roughness, $r_{rms}$, measured from $Mn_4N$ films grown at different temperatures.
Figure 3:
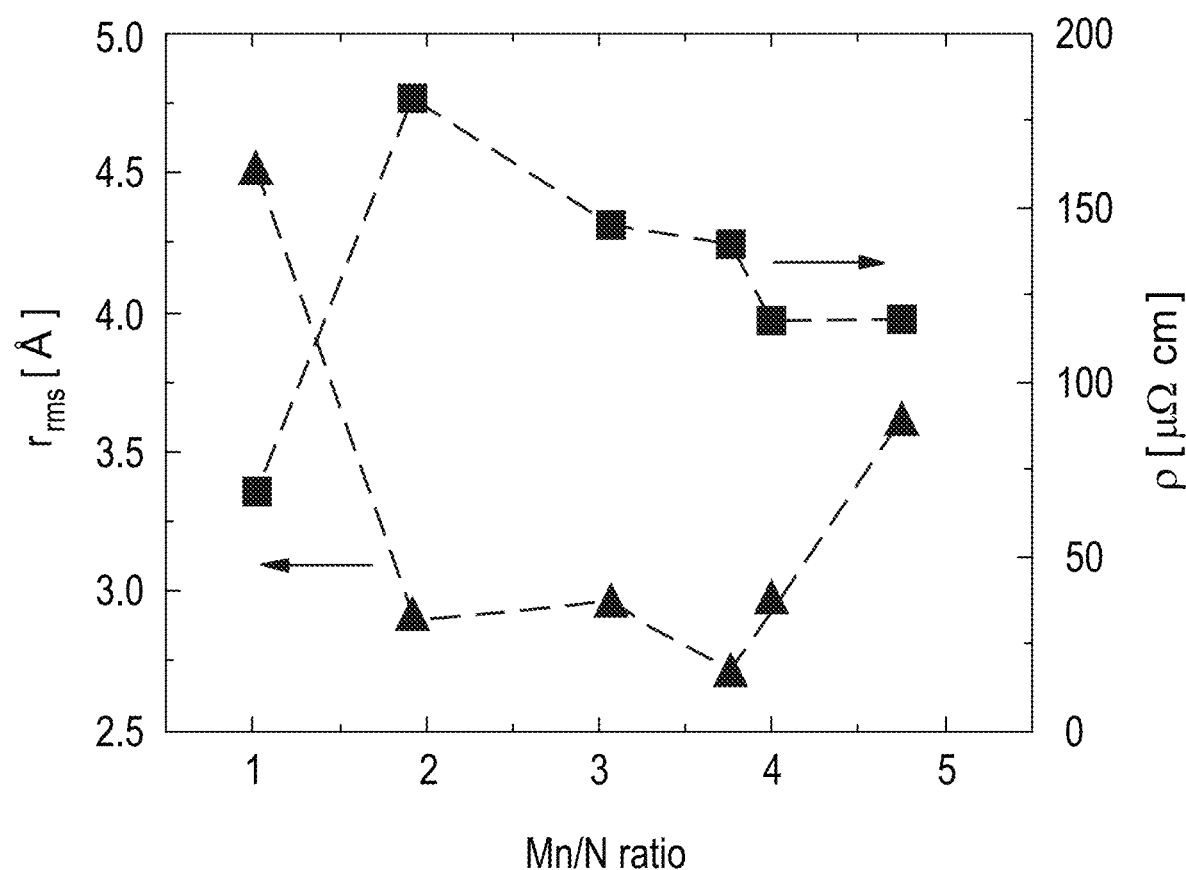
FIG. 3. The root mean square roughness, $r_{rms}$ and the resistivity of $Mn_xN$ films as a function of $Mn_xN$ ratio.

Film roughness is an important parameter which has to be minimized to obtain high quality MTJs with ultra-thin magnetic electrodes and tunnel barriers. Hence a series of $Mn_4N$ films were deposited at varied growth temperature and then capped with 30 Å Ta layer to prevent any oxidation of the $Mn_4N$ thin film by the ambient conditions. The film stack for these series of films was Si/250 Å $SiO_2$ /50 Å Ta/3 Å $Co_{20}Fe_{60}B_{20}$ /300 Å $Mn_4N$ at TG/30 Å Ta where growth temperature TG=room temperature, 200° C., 300° C., 400° C., and 500° C. The film roughness was determined with an atomic force microscope (AFM). FIG. 2 shows root-mean-squared surface roughness ($R_{rms}$) for various growth temperatures. The films deposited at Tg≤200° c. show very smooth surface with rims of ~3 Å. Thus $Mn_x$ N films where 2.5≤x≤4 were deposited at substrate temperature of TG≤200° C. henceforth. The composition dependence of Mn-Nitride films on the surface morphology is shown in FIG. 3. Here 300 Å $Mn_x$ N films with x=1, 2, 3, 3.76, 4, and 4.75 were deposited at room temperature. The film stack for these series of films was Si/250 Å $SiO_2$ /50 Å Ta/3 Å $Co_{20}Fe_{60}B_{20}$/300 Å $Mn_x$ N/20 Å Ta. Smooth films with $r_{rms}$ of <3 Å were obtained for Mn:N ratio of at least 2 and not more than 4. This figure also summarizes the resistivity of these MnN films. The film resistivity was determined close to the center of the sample by 4-point-in-line probe technique. The spacing between the 4 contacts was ~1 mm which was much smaller than the sample size (1" diameter). The resistivity of Mn-Nitride films increases sharply with the N content for films with Mn:N ratio of at least 1 and not more than 2. At higher Mn:N ratios≥3 the resistivity of the MnN films is insensitive to the composition. Moreover the resistivity of films with Mn:N ratio at least 2 and not more than 4 is comparable to metallic underlayers typically used in magnetic tunnel junction stacks (e.g. resistivity of Ti is 42 μΩ-cm and of Ta is 95 μΩ-cm). Moreover the resistivity of the Mn-Nitride films is almost five times lower than the TaN seed layer which is also used in MTJ stacks (e.g. resistivity of TaN film grown with 10% $N_2$ in Argon by reactive rf magnetron sputtering is reported to be ~700 μΩ-cm). Thus Mn-Nitride films suitable for use within the MTJ stack.

Figure 4:
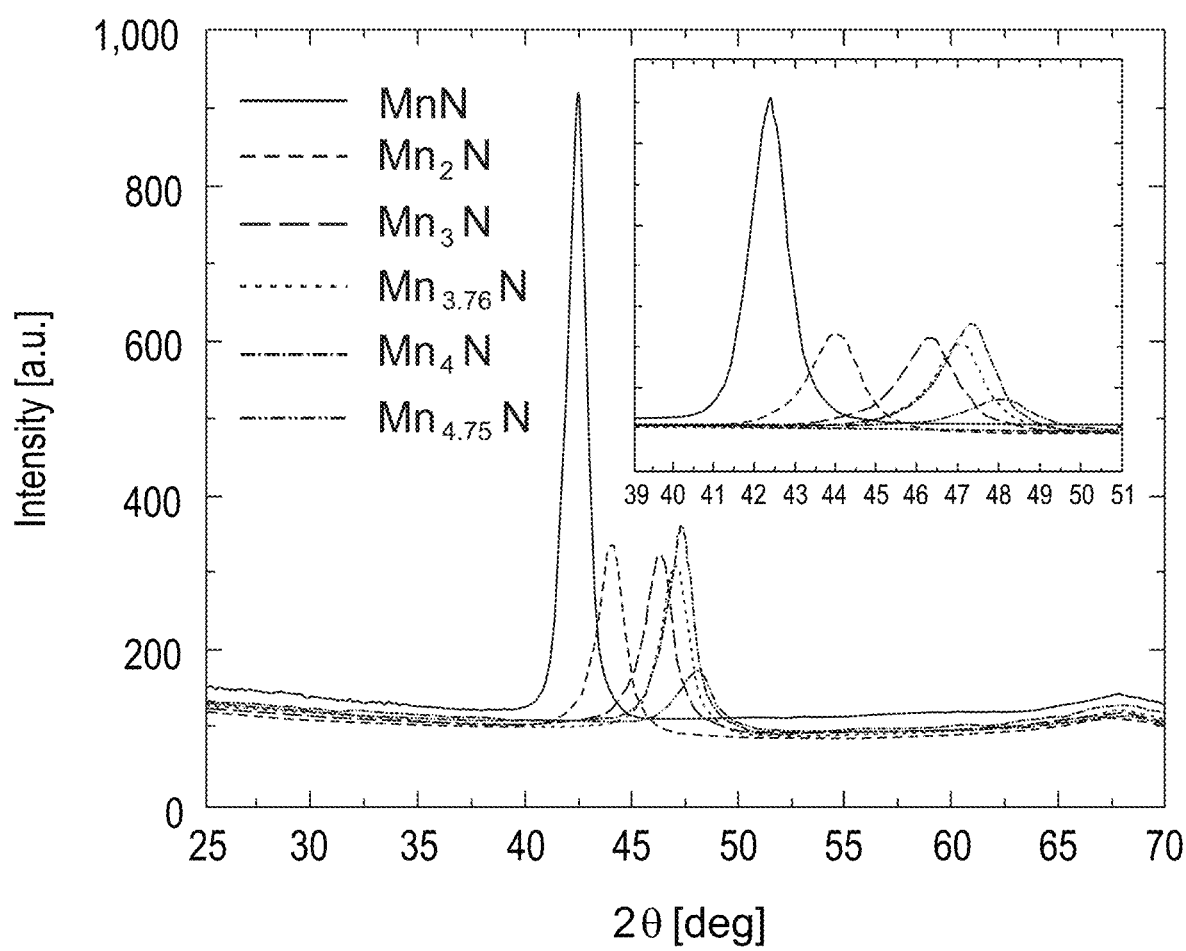
FIG. 4. Out-of-plane x-ray diffraction θ-2θ scans of 300 Å $Mn_xN$ films where x=1, 2, 3, 3.76, 4, and 4.75.
Figure 5:
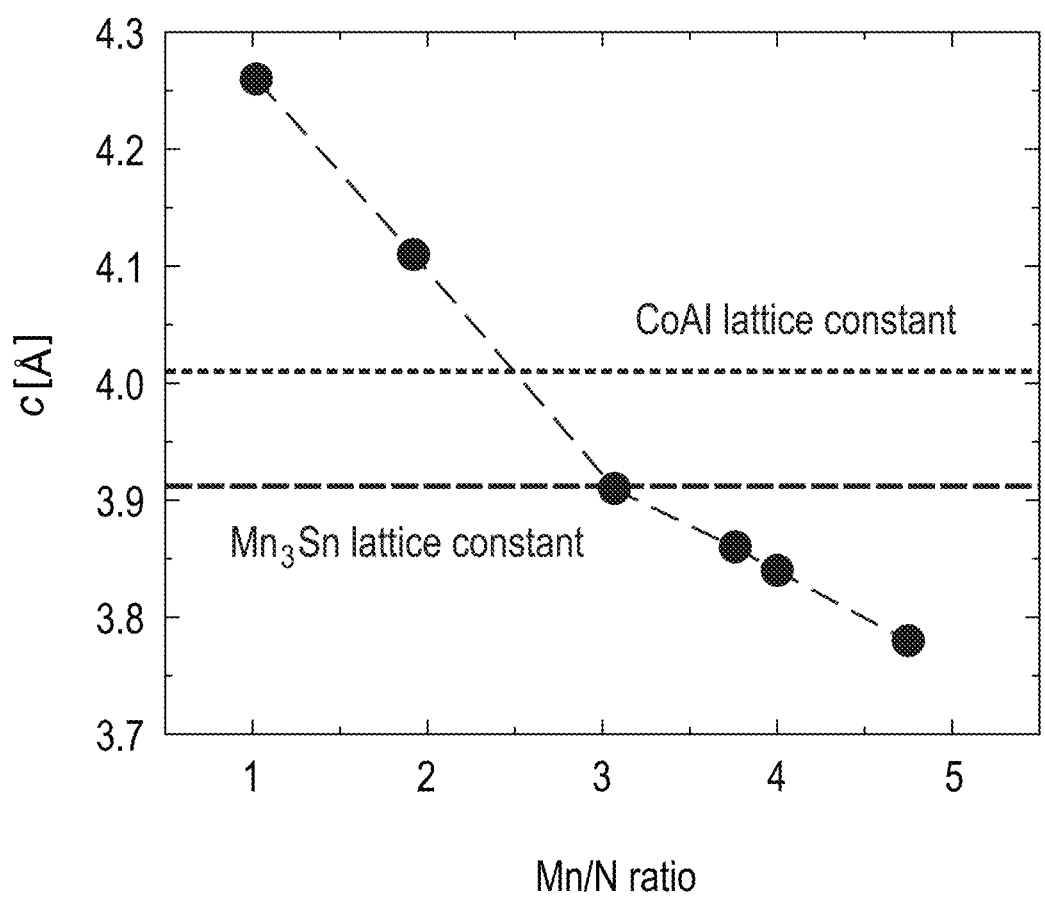
FIG. 5. Out-of-plane lattice constant of the $Mn_xN$ films determined from the XRD data displayed in FIG. 4.

X-ray diffraction (XRD) θ-2θ scans were measured for these films on a Bruker X-ray diffractometer with a GADDS area detector. These XRD measurements performed in the symmetric out-of-plane geometry and were sensitive to films texture. FIG. 4 shows the set of XRD scans from these films and a single diffraction peak is observed in each case. All $Mn_x$N films have the desired (001) orientation. The 2θ position and the intensity of the diffraction peak is strongly dependent of the composition of the Mn-Nitride film indicative of the associated variation of the out-of-plane lattice constant of the film which is summarized in FIG. 5. The out-of-plane lattice constant of the Mn-Nitride films varies almost linearly with the Mn:N ratio. Moreover for films with their Mn:N ratio in the range 2.5 to 4 their out-of-plane lattice constant matches well with that of one of the prototypical tetragonal Heusler compound, $Mn_3Sn$, as well as that of CoAl CTL. This lattice constant matching promotes the growth of tetragonal Heusler compounds with desired out-of-plane orientation. Furthermore, adjusting the Mn-Nitride composition provides the flexibility to tune the lattice mismatch by adjusting Mn:N ratio.

Figure 6:
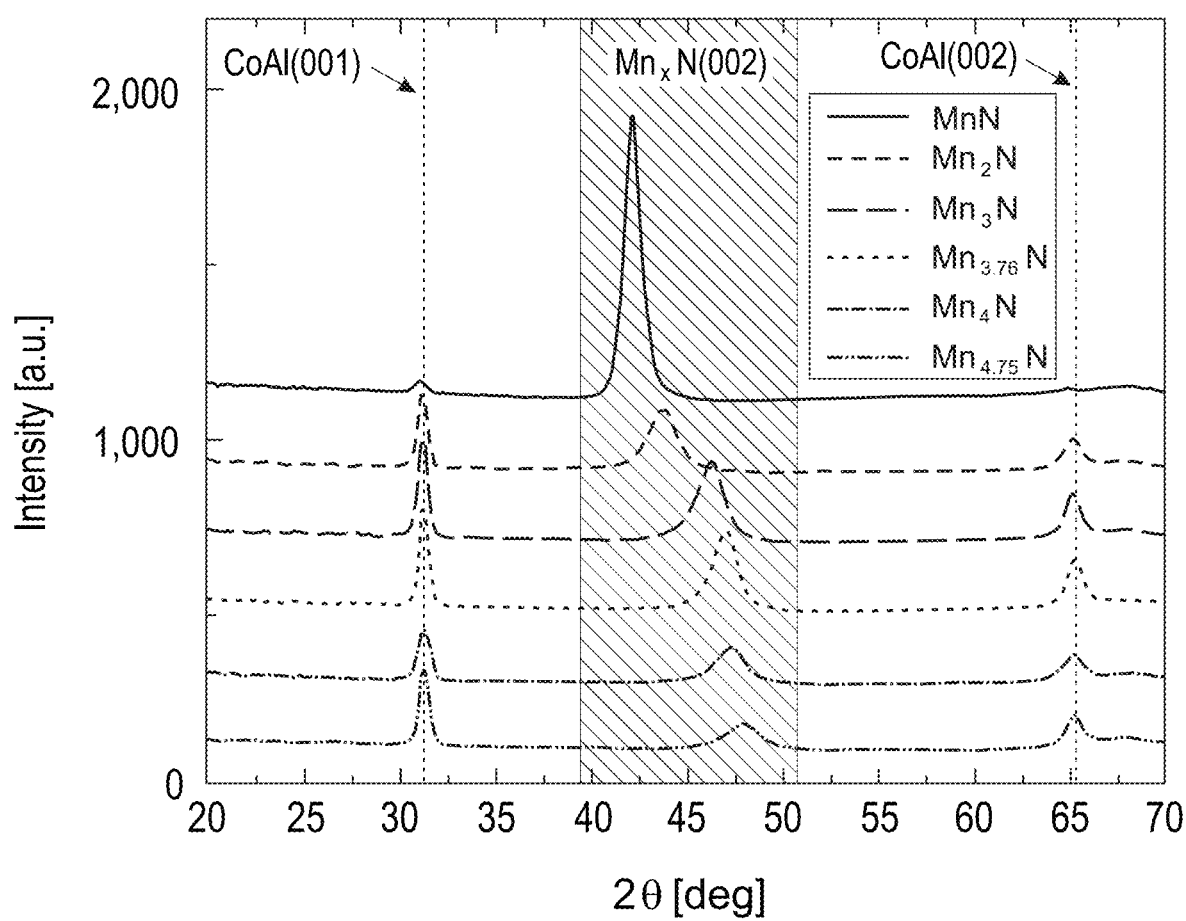
FIG. 6. Out-of-plane x-ray diffraction θ-2θ scans of 300 Å $Mn_xN$/300 Å CoAl layers where x=1, 2, 3, 3.76, 4, and 4.75.

The films of chemical templating layer of 300 Å CoAl were grown at room temperature by ion-beam deposition (IBD) or by dc-magnetron sputtering on 300 Å $Mn_x$N films with x=1, 2, 3, 3.76, 4, and 4.75. XRD measurements in out-of-plane geometry were performed to determine whether the $Mn_x$N films promote the necessary texture and alternating layer structure within the CoAl layer. The XRD data are included within FIG. 6 and were obtained from films with stack consisting of Si/250 Å $SiO_2$/50 Å Ta/3 Å $Co_{20}Fe_{60}B_{20}$/300 Å $Mn_x$N/300 Å CoAl/10 Å $Mn_3Sb$/20 Å MgO/20 Å Ta. In addition to the XRD peak from the $Mn_x$N layer which is delineated by a shaded region in the figure two peaks associated with CoAl layers were observed for all compositions of $Mn_x$N except for x=1. These CoAl peaks correspond to (001) and (002) reflections and prove the deposited CoAl layer has the desired (001) texture. The existence of the CoAl (001) superlattice peak clearly proves that there is an alternate layering of Co and Al which promotes ordering within the Heusler compound during its growth at room temperature.

Figure 7:
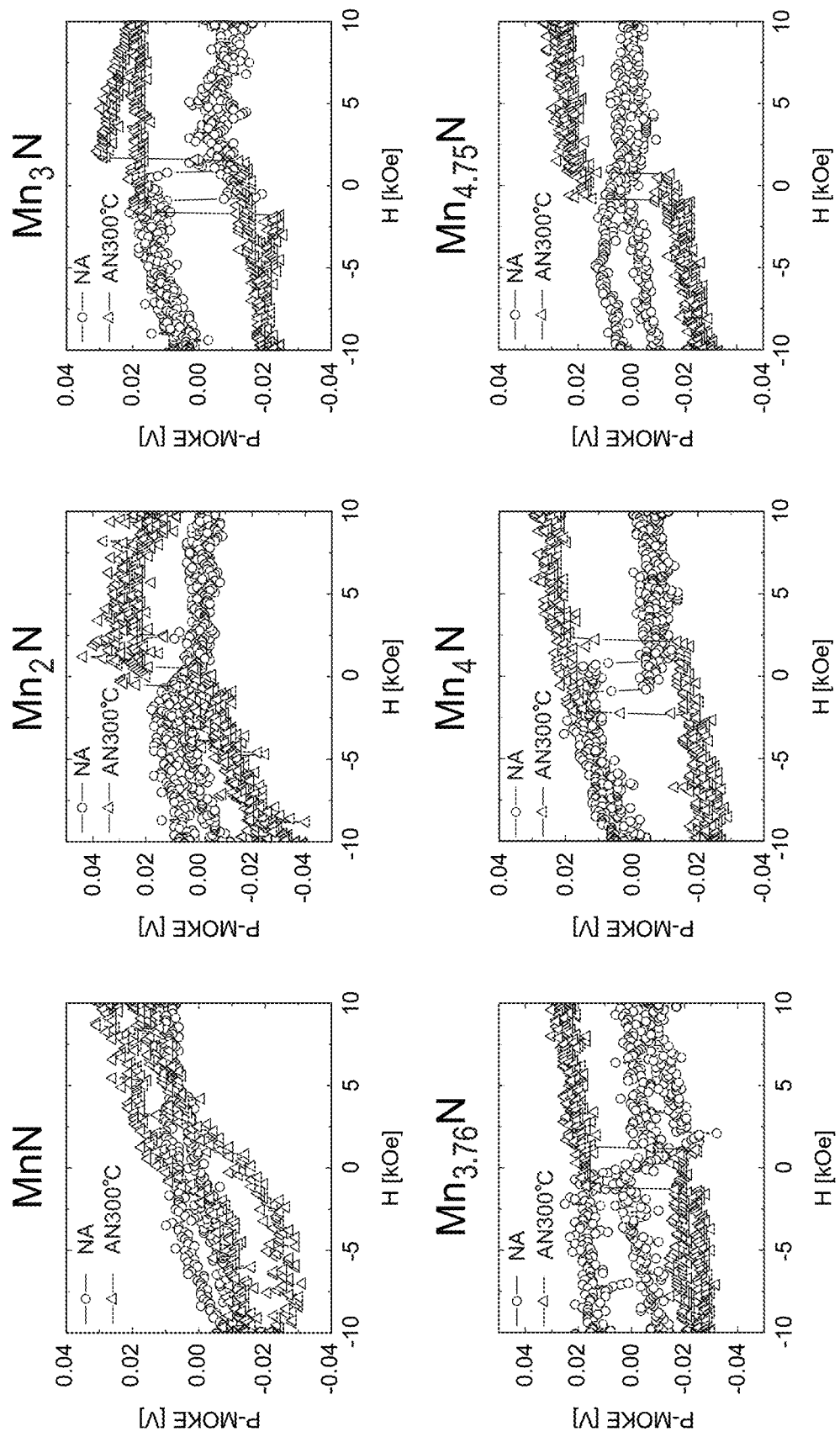
FIG. 7. P-MOKE hysteresis loops measured in as deposited state and after anneal at 300° C. for 30 min from 10 Å $Mn_3Sb$ Heusler compound deposited at room temperature on 300 Å $Mn_xN$/300 Å CoAl layers where x=1, 2, 3, 3.76, 4, and 4.75.

Perpendicular magneto-optical Kerr effect (P-MOKE) signal as a function of applied field (H) from this series of films was measured. FIG. 7 shows P-MOKE loops from the samples in their as deposited state and after annealing in a ultra-high vacuum furnace at 300° C. for 30 min in an applied field of 1 T. No hysteresis loop was observed for $Mn_x$N films with x=1 even after the annealing process. For $Mn_x$N films with x≥2 P-MOKE hysteresis loop was observed after the annealing process. The P-MOKE hysteresis loop demonstrates that the ultra-thin 10 Å-thick $Mn_3Sb$ Heusler layer is PMA. Interestingly, for $Mn_x$N films with x=3 and 4 P-MOKE hysteresis loops from the ultra-thin Heusler layer is observed even in their as deposited state making them as preferred Mn-Nitride compositions.

Figure 8:
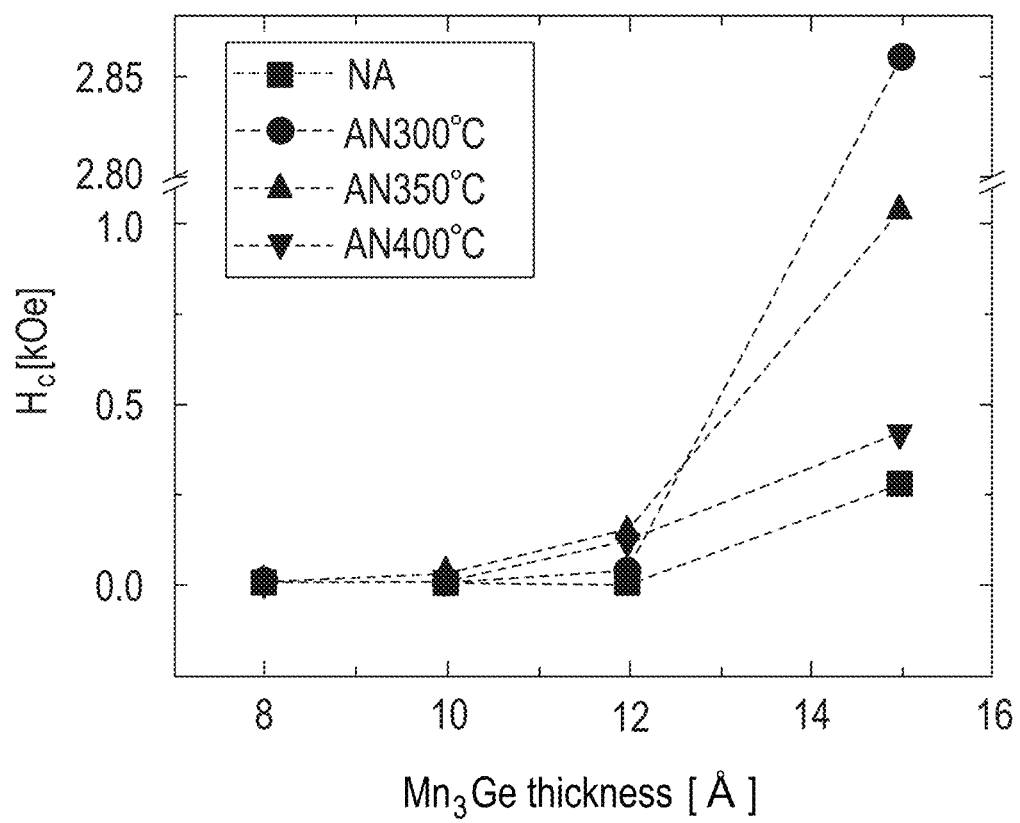
FIG. 8. Coercivity of the P-MOKE hysteresis loops measured for various thicknesses of $Mn_3Ge$ Heusler compound in as deposited state and after sequential anneals at 300° C., 350° C., and 400° C. for half hour in an applied field of 1 T.

Thermal stability of the coercivity ($H_e$) determined from P-MOKE hysteresis loops of a Heusler compound ($Mn_3Ge$) and its dependence on the thickness of $Mn_3Ge$ is shown in FIG. 8. The film stacks used in this study were Si/250 Å $SiO_2$/50 Å Ta/3 Å $Co_{20}Fe_{60}B_{20}$/300 Å $Mn_3N$/300 Å CoAl/t Å $Mn_3Ge$/20 Å MgO/20 Å Ta where t=8, 10, 12, and 15 Å. These films were deposited at room temperature and the P-MOKE hysteresis loops were measured in the as deposited state and after sequential anneals at 300° C., 350° C., and 400° C. for half hour in an applied field of 1 T. Films with $Mn_3Ge$ layers of thickness≤12 Å were stable and even withstood anneal at 400° C. without showing a significant change in the coercivity of the layer. Thus we conclude that the ultra-thin Heusler films grown at room temperatures on amorphous substrates (Si/250 Å $SiO_2$) have sufficient thermal stability needed to withstand the processing conditions used typically during CMOS manufacturing.

Figure 9:
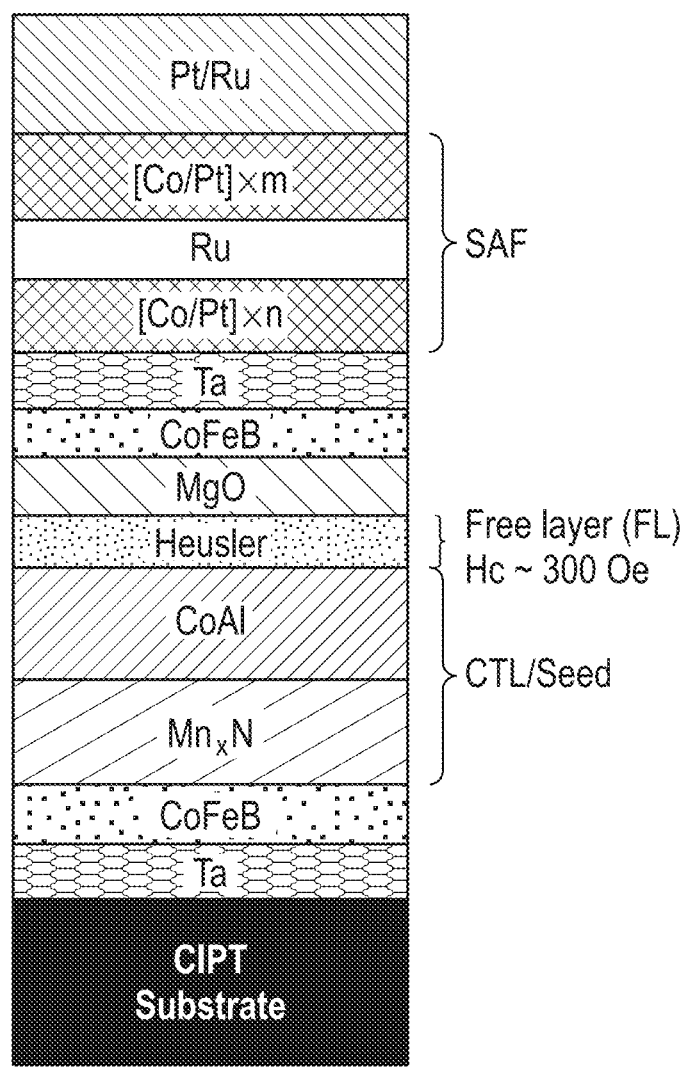
FIG. 9. Schematic of the typical MTJ device stack deposited on the CIPT substrate.

Another type of substrate which is routinely used to evaluate magnetic and switching properties of MTJ stacks is the CIPT substrates (CIPT refers to current in-plane tunneling). These substrates are Si substrates coated with thick (>1000 Å) layers of W and TiN which are highly conducting with extremely smooth surface finish ($r_{rms}$ of ~2 Å). FIG. 9 shows the schematic of the typical material stack grown on the CIPT substrate (sample number G1757-37). This material stack is: CIPT substrate/50 Å Ta/3 Å $Co_{20}Fe_{60}B_{20}$/200 Å $Mn_3N$/300 Å CoAl/10 Å $Mn_3Ge$/11.5 Å MgO/11.5 Å $Co_{20}Fe_{60}B_{20}$/2 Å Ta/[2.7 Å Co/7 Å Pt]$_3$/5 Å Co/9 Å Ru/5 Å Co/6 Å Pt/[2.7 Å Co/6 Å Pt]$_4$/5 Å Pt/100 Å Ru. The seed layer disclosed here, 200 Å $Mn_3N$/300 Å CoAl, promotes growth of the Heusler compound, 10 Å $Mn_3Ge$, with a large PMA. This Heusler compound is the magnetic memory electrode or the switchable magnetic layer. The tunnel barrier used preferably is MgO with (001) texture, although other (001)-oriented tunnel barriers may be used, such as CaO and LiF. Alternatively, an insulator with a spinel structure such as $MgAl_2O_4$ can be used as a tunnel barrier whose lattice spacing can be tuned by controlling Mg—Al composition (more preferably Mg—Al composition $Mg_{1-x}Al_{2-x}O_4$, wherein −0.5<x<0.5) which could result in better lattice matching with the Heusler compounds. The reference magnetic electrode overlying the tunnel barrier may comprise Fe, a CoFe alloy, or a CoFeB alloy, for example. The magnetic moment of the reference electrode is stabilized to high magnetic field (i.e. their coercivity is made significantly higher than the coercivity of the switchable magnetic layer) by contacting it to a synthetic anti-ferromagnet (SAF) structure. The SAF structure used here was [2.7 Å Co/6 Å Pt]$_3$/5 Å Co/9 Å Ru/5 Å Co/6 Å Pt/[2.7 Å Co/6 Å Pt]$_4$. It should be noted that the other SAF structures not described here could also be used instead. The capping layer may comprise Mo, W, Ta, Ru, Pt, even a conducting Nitride layer or a combination thereof. An optional (second) magnetic layer or so called "polarization enhancement layer" may be advantageously employed for even better performance (i.e. improve TMR or switching characteristics of the MTJ). This optional, second magnetic layer may include Fe, a CoFe alloy, $Co_2FeAl$, $Co_2MnSi$ or another Heusler compound. This optional magnetic layer could be place on either side or even on both sides of the tunnel barrier. Current may be induced by applying a voltage between the two magnetic electrodes, which are separated by the tunnel barrier.

Figure 10:
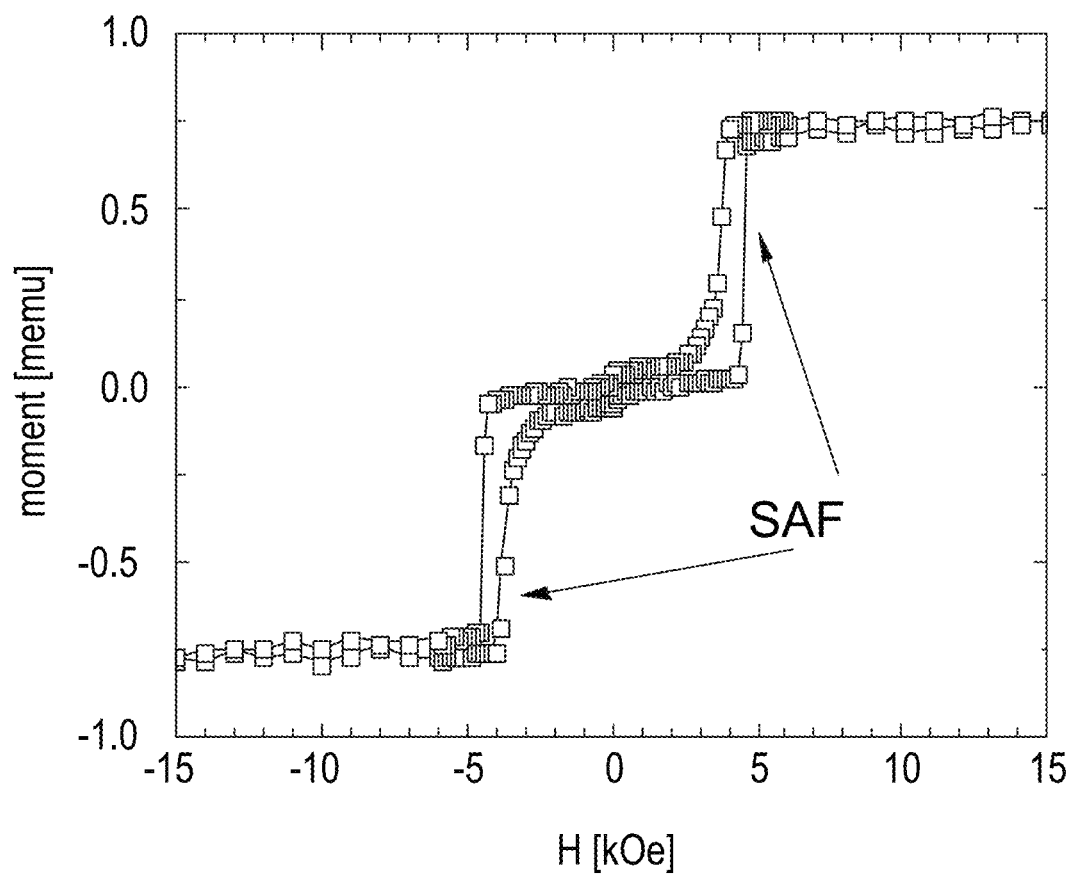
FIG. 10. VSM hysteresis loop measured for the stack described in FIG. 9.

FIG. 10 shows the magnetic hysteresis loops measured for this sample after it was annealed at 350° C. for 30 minutes in a high vacuum chamber with a field of 1 T applied along the sample normal. These vibrating sample magnetometer (VSM) measurements were made at room temperature with the applied magnetic field oriented along the sample normal. The switching of the SAF layers is observed at fields of ~3 to 4 kOe but the hysteresis loop of the 10 Å $Mn_3Ge$ Heusler compound is not visible due to its low magnetic moment. The switching field of the Heusler compound was determined to be <300 Oe from the current in-plane tunneling (CIPT) measurements (see Table 1). These measurements were performed on a commercial instrument supplied by CAPRES A/S. The magnetic field was applied along the sample normal with a permanent magnet positioned above the sample and the field strength was tuned by varying the position of this magnet relative to the sample. The TMR for this sample was determined to ~10% and the resistance-area product (RA) was ~25Ω-(μm)$^2$.

Figure 11:
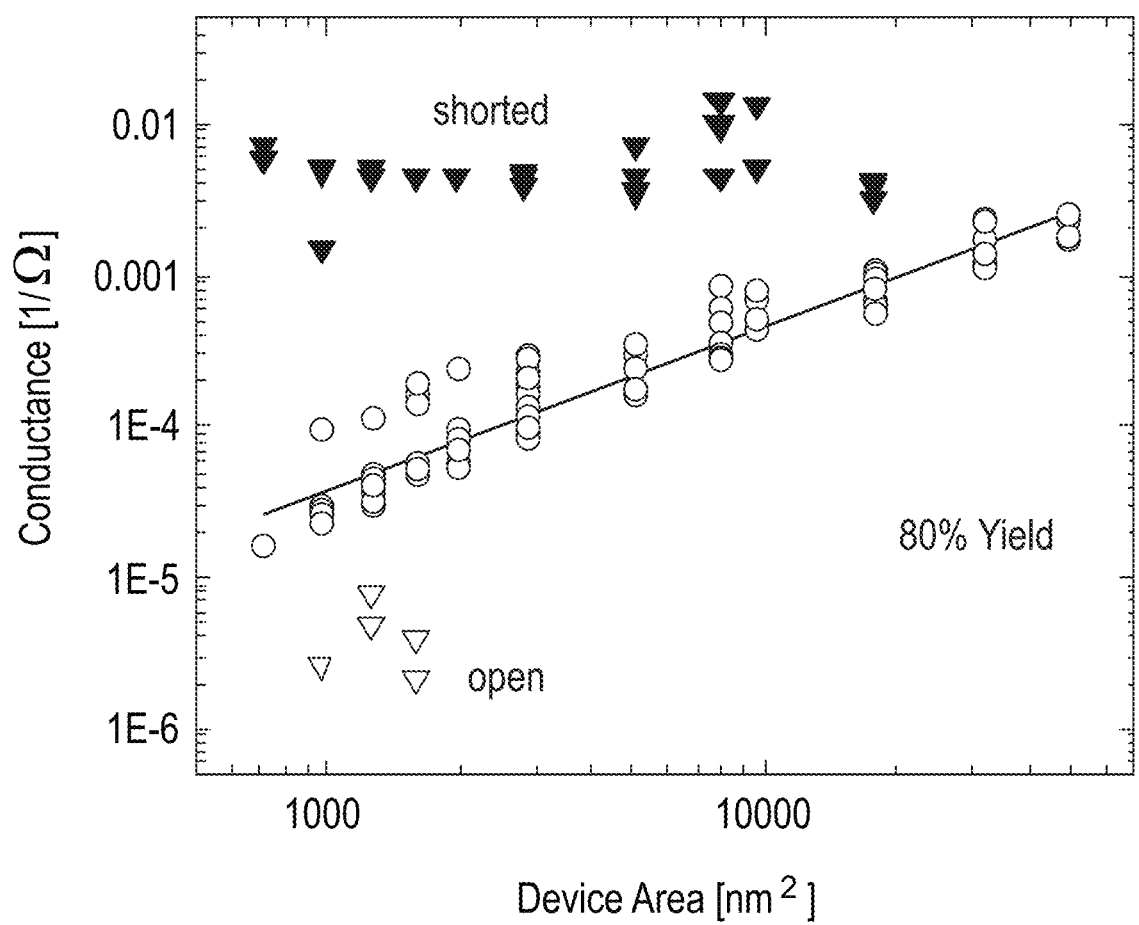
FIG. 11. Plot of MTJ device conductance versus the device area. Solid line shows linear least square fit to the conductance data, FIG. 12. Transmission Electron Microscopy (TEM) image of a cross-sectional view of a representative MTJ device shown in the inset on the left. The region within the black box was imaged in high resolution. The inset in bottom right shows the expanded view of the region within the dashed box.

The MTJ devices shaped like nano-pillars were patterned by e-beam lithography with sizes ranging from diameter of 30 nm to 250 nm. The MTJ stack etch was terminated after nominally 10% of the CoAl layer was removed to minimize side wall deposit. There were total of 256 devices on a single CIPT substrate with 15×15 mm$^2$ size. FIG. 11 shows the yield map as a plot of conductance versus device diameter for all the patterned MTJ devices. These electrical tests were conducted on a custom probe station. 80% of the MTJ devices showed the expected RA value of ~25Ω-μm$^2$. Moreover the variation of the MTJ device conductance is linear with device diameter in this log-log plot. The solid line is the linear least squares fit to these data and has a slope of 1.07 which is close to the expected value of 1. Switching of the magnetic state both by field and current was probed for several working devices.

Figure 12:
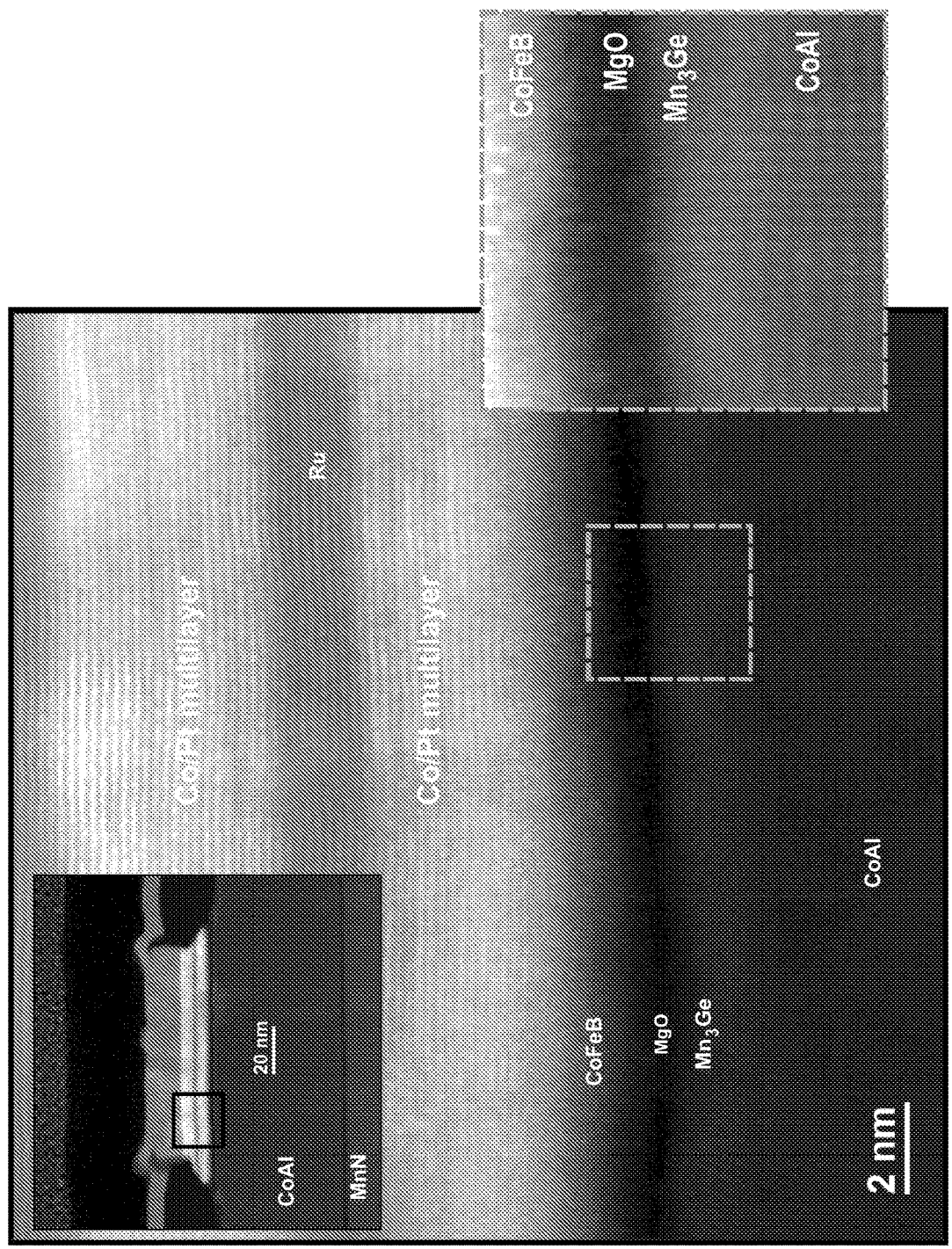

FIG. 12 the transmission electron microscopy image of a STT switchable MRAM device (device number 614) from another sample containing a Heusler storage layer (sample G1746-39). This material stack which is slight variation from the one detailed above is: CIPT substrate/50 Å Ta/3 Å $Co_{20}Fe_{60}B_{20}$ 200 Å $Mn_3N$/300 Å CoAl/14 Å $Mn_3Ge$/12 Å MgO/11 Å $Co_{20}Fe_{60}B_{20}$/3 Å Ta/[2.5 Å Co/5 Å Pt]$_2$/5 Å Co/9 Å Ru/5 Å Co/5 Å Pt/[2.5 Å Co/5 Å Pt]$_4$/5 Å Pt/100 Å Ru. The as deposited material stack was annealed at 350° C. for 30 minutes in a ultra-high vacuum chamber with a field of 1 T applied along the sample normal prior to e-beam lithographic patterning into nano-pillar MTJ devices. The diameter of this MTJ device was determined to be 102 nm in excellent agreement to its nominal diameter of 100 nm. The slight undercut in the device shape arises from the side wall removal step. The high resolution image show various layers comprising the deposited material stack. The CoAl layer has bcc texture with (001) orientation along sample normal. Moreover, the expanded view of the region within the dashed box indicates $Mn_3Ge$ layer resembles closely the structure of the underlying CoAl layer and grows with its tetragonal axis along the sample normal.

Figure 13:
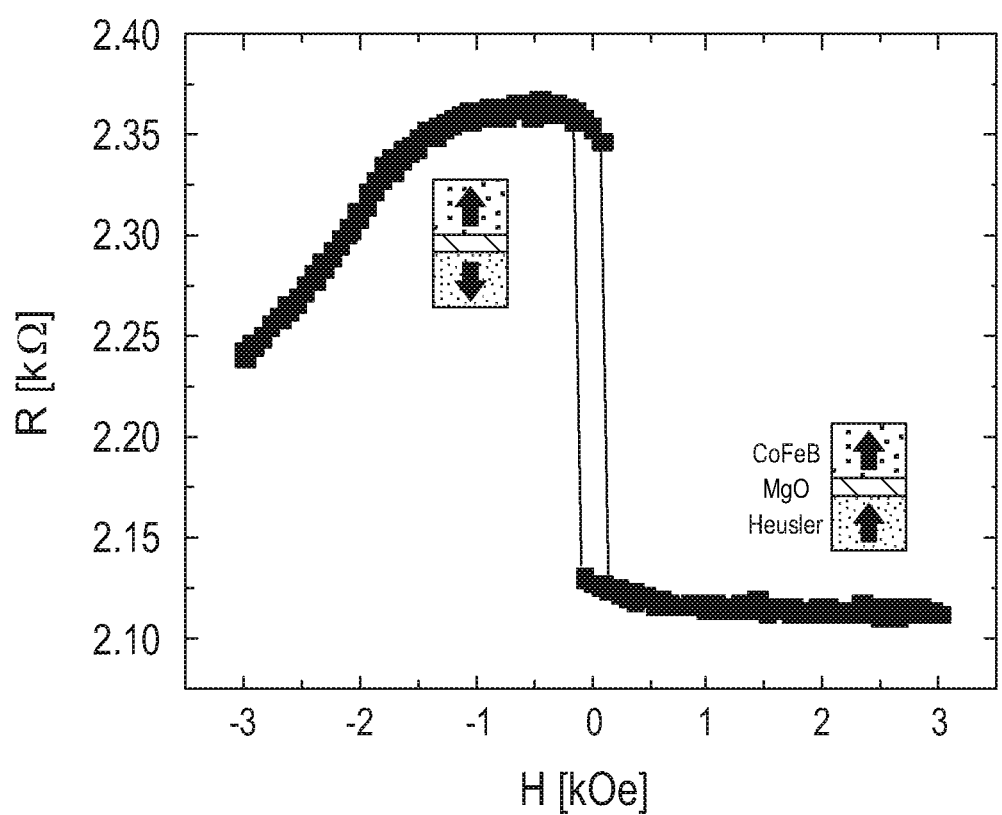
FIG. 13. Resistance (R) versus applied field (H) for a MTJ device with diameter of 110 nm (nominal).
Figure 14:
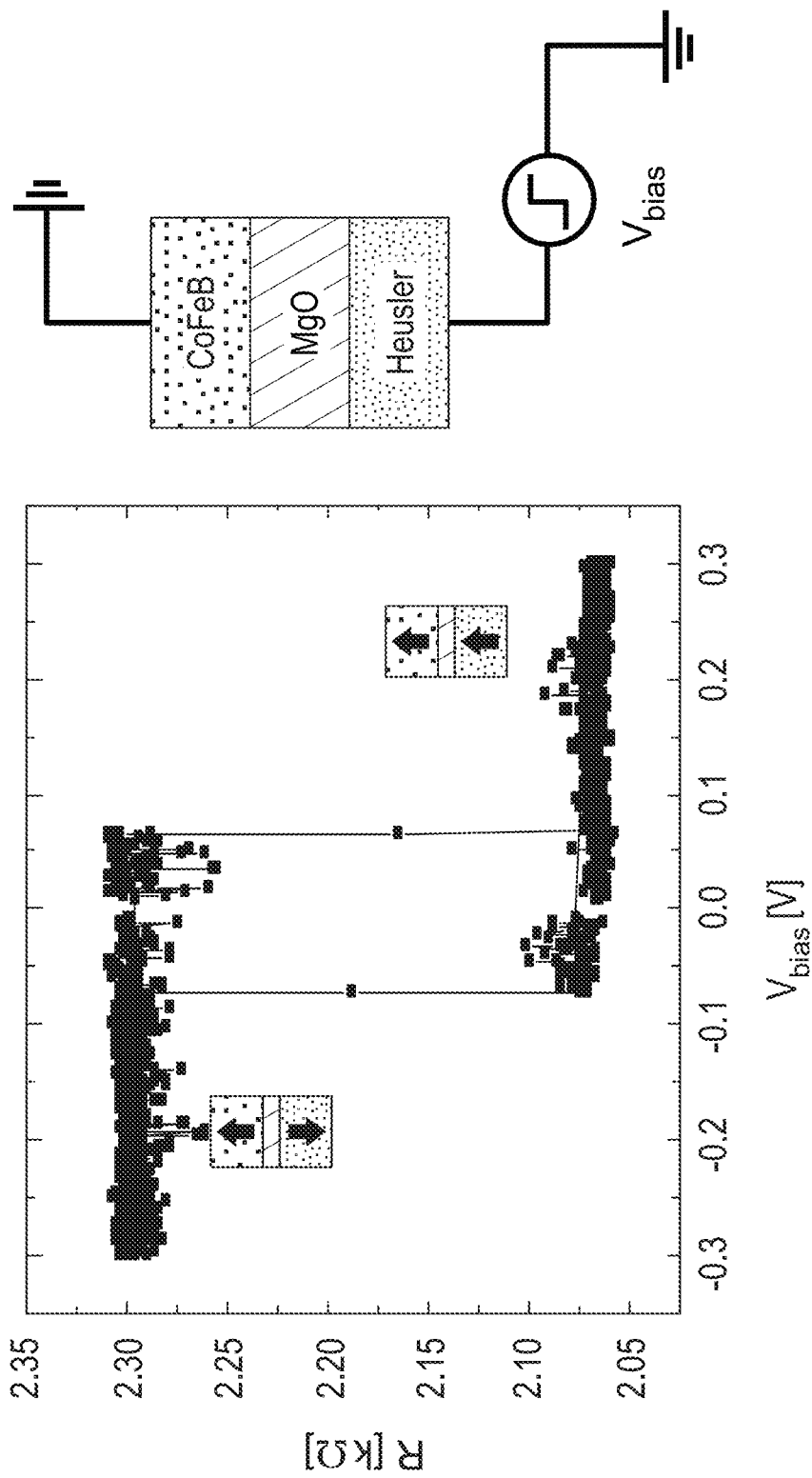
FIG. 14. Resistance (R) versus bias voltage for the same MTJ device as used in FIG. 12. The schematic on the right describes the electrical connection to the device.

FIG. 13 shows the resistance (R) versus applied field (H) loop measured from a 110 nm diameter (nominal) device with a field applied along the perpendicular to the substrate (device number 501 and sample number G1757-37). This R-H loop was measured in a constant current mode with a sense voltage ($V_{sense}$) of 50 mV. The switching between the low and high resistance state is due to rotation of the magnetic moment of the Heusler layer by application of the external magnetic field (see the two insets included within FIG. 13). The Heusler layer switches sharply whereas the SAF structure switches much more gradually (see the data at field<−2 kOe). The TMR for this device was 9.6% consistent with the CIPT measurements on the blanket film. FIG. 14 shows the resistance of the same device measured following application of bias voltage ($V_{bias}$) pulses of 1 msec duration (R-V loop). The schematic on the right shows that a pulse generator in series with the device generated $V_{bias}$ pulses. The electrical current flow direction was opposite for the opposite polarity of $V_{bias}$. The resistance of the device switches above a threshold $V_{bias}$ and the resistance of the two states (see the two insets within FIG. 14) is similar to the resistance of the two states in the R-H loops (FIG. 13). This indicates that magnetization of the Heusler layer toggles between same two states during STT switching as observed during the magnetic field induced switching. The STT switching of the Heusler layer was also independently confirmed by determining the switching phase diagram in which threshold switching voltages for switching between high to low and low to high resistance states (i.e. parallel to anti-parallel and anti-parallel to parallel magnetization states) were found to be strongly dependent on the externally applied magnetic field. The point to point noise in the R-V loop (FIG. 14) is higher than in the R-H loop (FIG. 13) due to the lower integration time used within these measurements. The current density, $J_c$, needed for STT switching of the device using 1 msec voltage pulse was ~6×10$^5$ Acm$^{-2}$. This $J_c$ is one order of magnitude lower than similar size devices with CoFeB switchable magnetic memory electrode. This lower $J_c$ is highly desirable as the MTJ devices are scaled below 20 nm lithography node.

Figure 15:
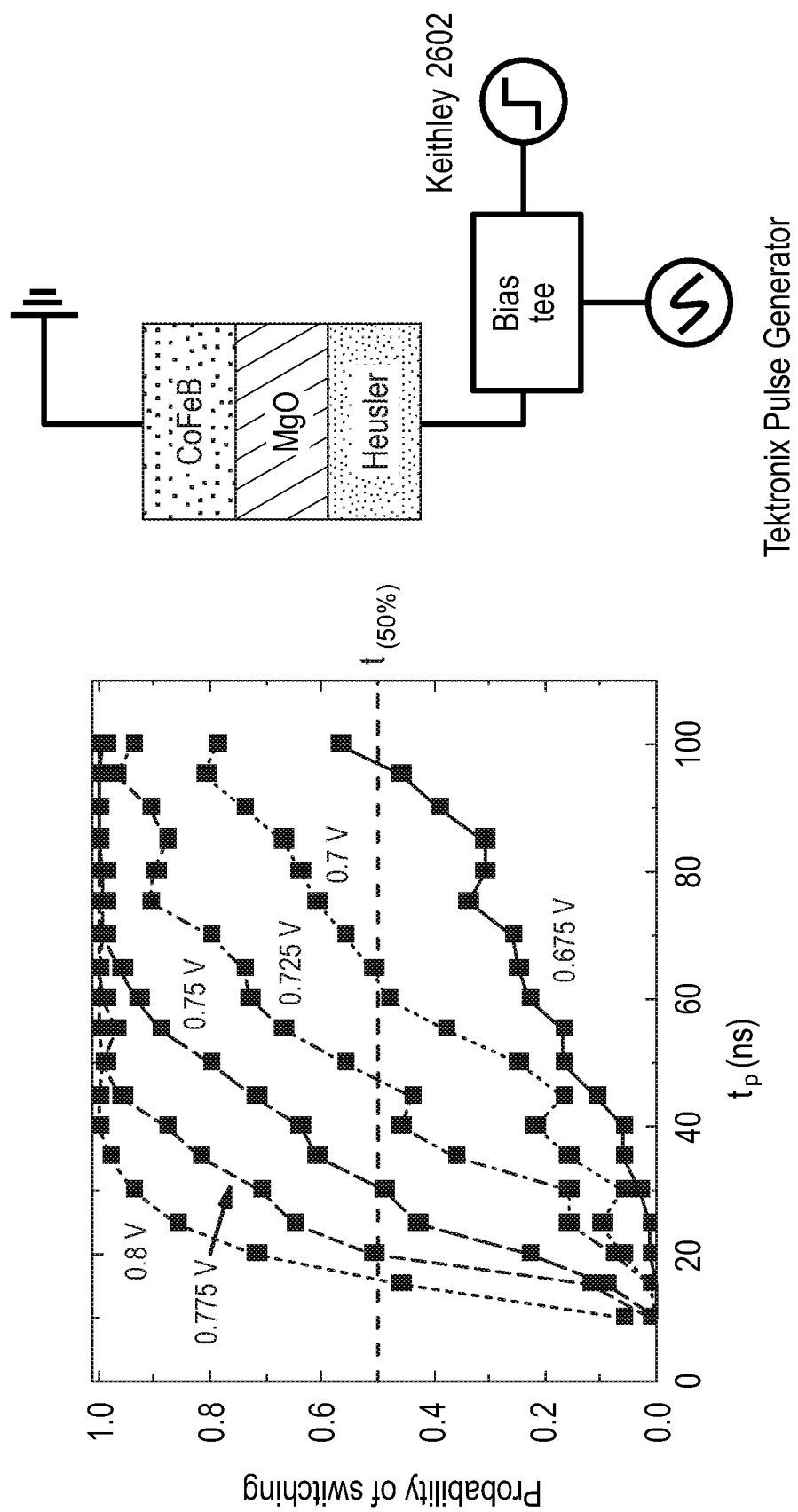
FIG. 15. Measured probability of switching as a function of duration in nano-second of the voltage pulse. The schematic on the right describes the electrical connection to the device.

FIG. 15 measures probability of switching a MTJ device with device diameter of 100 nm (nominal) as a function of nano-second voltage pulses (device number 602 and sample number G1757-37). The schematic of the measurement set-up used is shown on the right. The MTJ device was first set to its low or high resistance state (parallel or anti-parallel magnetization state) by passing 1 ms reset pulse through the device. Next switching voltage pulses ($V_p$) with pulse widths of at least 2 ns and not more than 100 ns and of the polarity needed to switch the resistance/magnetization state of the device were passed through the device. Total of 100 pulses were used and the probability of switching the MTJ device resistance was determined by reading the device resistance after each pulse. The $t_{(50\%)}$ which is the pulse width for 50% probability of switching at any given $V_p$ increases for lower $V_p$.

Figure 16:
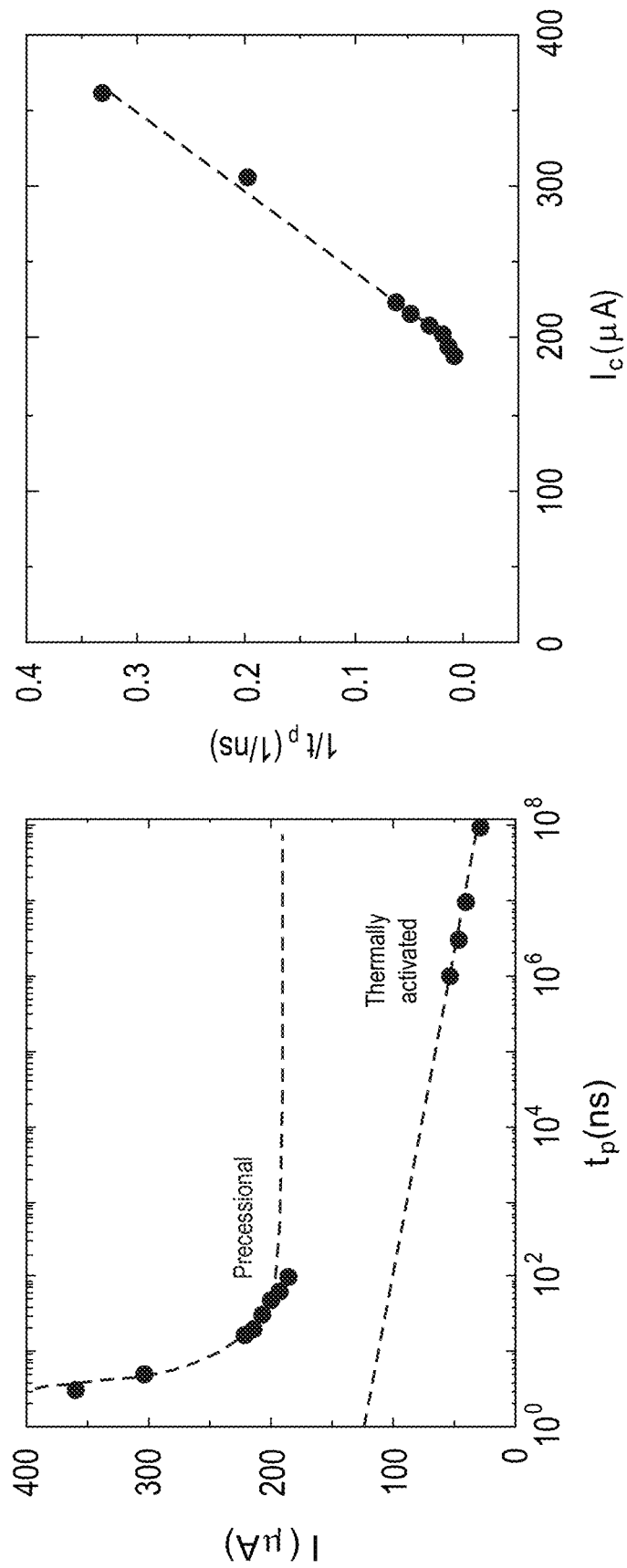
FIG. 16. Switching current versus duration of the voltage pulse (plot on the left). The dependence of reciprocal of the voltage pulse duration on switching current is plotted on the right.

FIG. 16 summarizes the switching current ($I_c$) versus pulse width ($t_p$) data. These data falls in two regimes, precessional (for $t_p$<~100 ns) and thermally activated ($t_p$>~1 ms), see plot on the left. The dashed lines show the fit of the macro-spin model (see D. Bedau et al, Appl. Phys. Lett. 97, 262502 (2010)). The inverse of $t_p$ (for $t_p$<~100 ns) varies linearly with $I_c$ indicative of conservation of angular momentum (see plot on the right in FIG. 16).

Certain structures described herein may also be used in racetrack memory devices. In this case, the racetrack is a nanowire that may include a substrate, an optional seed layer, a $Mn_xN/CoAl$ layer where $2.5 \leq x \leq 4$, and a first magnetic layer of a Heusler compound. (See the discussion above with respect to FIG. 9 for possible compositions of these layers. Note that in a racetrack memory device the tunnel barrier and the reference or fixed magnetic layer shown in FIG. 9 would not normally be present.) Magnetic domain walls may be moved along this racetrack, as described in U.S. Pat. No. 6,834,005. Data may be read out of (and stored in) the racetrack by interrogating (or changing) the orientation of the magnetic moment of the magnetic material between adjacent domain walls within the racetrack.

The various layers described herein may be deposited through any one or more of a number of methods, including magnetron sputtering, electrodeposition, ion beam sputtering, atomic layer deposition, chemical vapor deposition, and thermal evaporation.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A device, comprising:
   a first layer including Mn and N forming $Mn_x$ N, wherein $2.5 \leq x \leq 4.0$;
   at least one templating layer including Co and at least one of Ga, Ge, Sn and Al, the at least one templating layer being directly on the first layer such that the first layer is closer to a substrate than the at least one templating layer;
   a first magnetic layer having a volume uniaxial magnetic crystalline anisotropy, wherein the magnetic moment of the first magnetic layer is stable substantially perpendicular to the first magnetic layer, the first magnetic layer being on the at least one templating layer such that the first magnetic layer is in physical contact with the at least one templating layer, the first magnetic layer having a thickness of not more than twelve Angstroms and including a Heusler compound; and
   a tunnel barrier in proximity to the first magnetic layer, wherein the orientation of the magnetic moment of the first magnetic layer is reversible using spin transfer torque induced by current passing between and through the first magnetic layer and the tunnel barrier.

2. The device of claim 1, wherein the first magnetic layer is the Heusler compound.

3. The device of claim 2, wherein the Heusler compound is selected from the group consisting of $Mn_x$ Ge, $Mn_x$ Sn, $Mn_x$ Sb, and combinations thereof, where x is in the range 2.5-3.5.

4. The device of claim 2, wherein the Heusler compound is a ternary tetragonal Heusler.

5. The device of claim 4, wherein the ternary Heusler is selected from the group consisting of $Mn_2CoSn$, $Mn_2CoSb$, $Mn_2OsSn$, and $Mn_2RuSn$.

6. The device of claim 5, wherein the ternary Heusler includes $Mn_2CoSn$.

7. The device of claim 1, comprising a second magnetic layer in proximity with the tunnel barrier.

8. The device of claim 7, wherein the tunnel barrier is MgO.

9. The device of claim 7, wherein the tunnel barrier is an insulator that lattice matches the first magnetic layer and allows for spin filtering, the tunnel barrier including $Mg_{1-x}Al_{2-x}O_4$, wherein $-0.5<x<0.5$.

10. The device of claim 7 wherein the device is a non-volatile memory element.

11. The device of claim 1, wherein the Heusler compound includes Mn.

12. The device of claim 11, wherein the Heusler compound is a binary Heusler compound.

13. A method, comprising:
    switching an orientation of a magnetization of a first magnetic layer by passing a current through a device, across a tunnel barrier, the device including a first layer including Mn and N forming $Mn_x$ N, wherein $2.5 \leq x \leq 4.0$, at least one templating layer being directly on the first layer such that the first layer is closer to a substrate than the at least one templating layer, the first magnetic layer on the at least one templating layer such that the first magnetic layer is in physical contact with the at least one templating layer, the tunnel barrier layer and a second magnetic layer, the at least one templating layer including Co and Ga, Ge, Sn and Al, the first magnetic layer having a volume uniaxial magnetic crystalline anisotropy, wherein the magnetic moment of the first magnetic layer is stable substantially perpendicular to the first magnetic layer, the tunnel barrier being in proximity to the first magnetic layer, the tunnel barrier being between the first magnetic layer and the second magnetic layer, the orientation of the magnetic moment of the first magnetic layer being reversed using spin transfer torque induced by the current passing between and through the first magnetic layer and the tunnel barrier, the second magnetic layer being in proximity with the tunnel barrier, the first magnetic layer having a thickness of not more than twelve Angstroms and including a Heusler compound.

14. The method of claim 13, wherein the Heusler compound includes Mn.

15. The method of claim 14, wherein the Heusler compound is a binary Heusler compound.

16. A device, comprising:
    a substrate;
    a $Mn_x$ N layer overlying the substrate, wherein $2.5 \leq x \leq 4$;
    a templating structure including Co and at least one of Ga, Ge, Sn and Al, the templating structure directly overlying the $Mn_x$ N layer;
    a first magnetic layer that includes a Heusler compound, the magnetic layer being in physical contact with the templating structure, wherein the first magnetic layer has a magnetic moment that is stable perpendicular to the first magnetic layer and switchable by spin transfer torque, the first magnetic layer having a thickness of not more than twelve Angstroms;
    a tunnel barrier overlying the first magnetic layer; and
    a second magnetic layer in contact with the tunnel barrier.

17. The device of claim 16, comprising a capping layer in contact with the second magnetic layer.

18. The device of claim 16, wherein the first magnetic layer includes Mn and an element selected from the group consisting of Sn, Sb, and Ge.

19. The device of claim 16, wherein the first magnetic layer further includes Co.

20. A device, comprising:
a substrate;
a $Mn_x N$ layer overlying the substrate, wherein $2.5 \leq x \leq 4$;
a templating structure including Co and at least one of Ga, Ge, Sn and Al, the templating structure directly overlying the $Mn_x N$ layer;
a first magnetic layer that includes a Heusler compound, the magnetic layer being in physical contact with the templating structure, wherein the first magnetic layer has a magnetic moment that is stable perpendicular to the first magnetic layer and switchable using spin transfer torque, the first magnetic layer having a thickness of not more than twelve Angstroms;
a tunnel barrier overlying the first magnetic layer; and
a second magnetic layer in contact with the tunnel barrier.

* * * * *